United States Patent [19]

Kyriakos

[11] Patent Number: 4,468,638
[45] Date of Patent: Aug. 28, 1984

[54] LINEAR SWEEP FREQUENCY MODULATOR FOR FM/CW RADIO ALTIMETER

[75] Inventor: Constantinos S. Kyriakos, Deerfield Beach, Fla.

[73] Assignee: The Bendix Corporation, Southfield, Mich.

[21] Appl. No.: 347,839

[22] Filed: Feb. 11, 1982

[51] Int. Cl.³ .............................................. H03B 23/00
[52] U.S. Cl. ........................................ 331/178; 331/4; 328/185; 343/12 A
[58] Field of Search ..................... 331/178, 4; 328/184, 328/185; 307/228; 343/12 R, 12 A, 14

[56] References Cited

U.S. PATENT DOCUMENTS 3,341,849  9/1967  Cordry et al. .................... 343/12 A

FOREIGN PATENT DOCUMENTS

2835851  2/1980  Fed. Rep. of Germany ...... 331/178

Primary Examiner—Siegfried H. Grimm
Assistant Examiner—David C. Mis
Attorney, Agent, or Firm—Bruce L. Lamb; W. G. Christoforo

[57] ABSTRACT

A linear sweep frequency modulator for a varactor tuned transistor microwave oscillator used in an FM/CW radio altimeter where the oscillator-frequency v. varactor bias characteristic is non-linear. A linear triangular wave is converted by means of a function generator to the non-linear wave required for varactor bias to cause linear frequency modulation of the oscillator. Linearity of modulation is tested by measuring variations in the period of a calibration signal derived from a delay line. Variations in the period of the calibration signal are measured by determining the difference between the average and the instantaneous calibration period and sampling the difference during each cycle of the triangular wave, once during the upswing thereof when the oscillator is at low frequency and once during the down swing thereof when the oscillator is at high frequency and separately integrating the up swing and down swing samples. By applying both results of integration to the function generator it thereby has its biases controlling the low frequency and the high frequency operation of the oscillator separately adjusted.

14 Claims, 8 Drawing Figures

LINEAR SWEEP FREQUENCY MODULATOR FOR FM/CW RADIO ALTIMETER

The present invention relates to a linear modulation control for sweep frequency modulating a continuous wave oscillator used in an FM/CW radio altimeter.

Frequency modulated, continuous wave (FM/CW) radio altimeters comprise a well known type of instrument for providing an indication of the height of an aircraft above the terrain. In such instruments a continuous radio wave which has a frequency varying linearly with time is transmitted from the aircraft to the ground. The ground reflections of the transmitted wave are received by the aircraft and are mixed with the wave then being transmitted to produce a difference frequency. The delay between transmission of any particular phase of the wave and the reception of the reflection of that phase is directly proportional to the height of the aircraft above the ground. Because of the linear relationship between the frequency of the transmitted wave and time, the difference between the frequencies of the transmitted and received waves is directly proportional to the height of the aircraft. The instrument produces an indication of the altitude of the aircraft by measuring the frequency of the difference frequency signal.

It will be appreciated that the accuracy of altitude indication by such an instrument directly depends upon the linearity of the variation of the transmitter frequency with time. In prior radio altimeters, as disclosed for example in U.S. Pat. No. 3,341,849 to Cordry et al., linear frequency modulation of the transmitter by a triangular modulating wave is fairly straight forwardly accomplished by frequency modulating an oscillator operating in the VHF band and multiplying the oscillator frequency to the microwave region.

The Cordry et al. patent recognizes the importance of maintaining linearity in the transmitter modulation characteristic and for that purpose provides means including a fixed delay line for adjusting the average slope of the modulation wave.

There are now available transistors capable of operating at microwave frequencies. Considerable simplification of the transmitter circuitry and improvement of efficiency are made possible by such transistors. However, it has proven difficult to frequency modulate transistor microwave oscillators linearly by the most direct means, which is to incorporate a voltage variable reactance (varactor) in the tuning circuit of the oscillator. The oscillator frequency as a function of tuned circuit reactance is logarithmic and the varactor reactance as a function of bias voltage is also logarithmic. The composite result of these functions is a frequency v. voltage oscillator characteristic which is highly non-linear.

One obvious means of linearly sweep frequency modulating an oscillator having a non-linear frequency v. modulating voltage characteristic is to apply to the oscillator, rather than a linear modulating voltage, a non-linear modulating voltage which is inversely related to the frequency v. voltage characteristic of the oscillator. Difficulties encountered in employing such a technique stem from the facts that the varactor reactance v. voltage function is highly temperature dependent and that there are large variations in varactor characteristics due to manufacturing tolerances. The means previously disclosed by Cordry et al. for adjusting the average slope of the modulation waveform are inadequate to compensate for errors arising in a system requiring a non-linear oscillator frequency control voltage to produce a linear frequency v. time characteristic. The reason for such inadequacy lies in the fact that to maintain linear frequency modulation with a non-linear control function it may be necessary to adjust the non-linear control function in one sense during one portion of the function and to adjust in the opposite sense during the remaining portion of the function.

It is an object of the present invention to provide a linear sweep frequency modulation means for an oscillator operating at microwave frequency.

It is a further object of the invention to provide a sweep frequency modulator for a transistor microwave oscillator which will maintain modulation linearity throughout a wide range of operating temperatures and for a substantial range of manufacturing tolerances for the oscillator components.

Briefly, the invention comprises, in an FM/CW radio altimeter, a transistor microwave oscillator incorporating a varactor in the tuning circuit thereof. The oscillator frequency is varied linearly by changing the bias applied to the varactor in accordance with the output of a non-linear function generator. The non-linear function generator is designed to accept a linear input signal and to modify the same to produce the particular non-linear function required by the oscillator frequency v. varactor bias characteristic to produce linear sweep frequency modulation. The linearity of modulation is determined by measuring the difference between the short term and long term average values of the period of a calibration signal, which calibration signal is obtained by mixing direct oscillator output with oscillator output subject to a fixed delay. The difference between the short term and long term average values of the calibration signal is sampled during a time the oscillator frequency is at a lower value and during the time the oscillator frequency is at a higher value and the samples are used to control separately the circuits of the non-linear function generator responsible for generating the portions of the output thereof corresponding to the lower and higher frequency outputs of the oscillator. The control of the non-linear function generator circuits is applied in such sense as to reduce the difference between the short term and long term average values of the period of the calibration signal, thereby effecting closed loop control of the linearity of frequency modulation of the oscillator.

Figure 1:
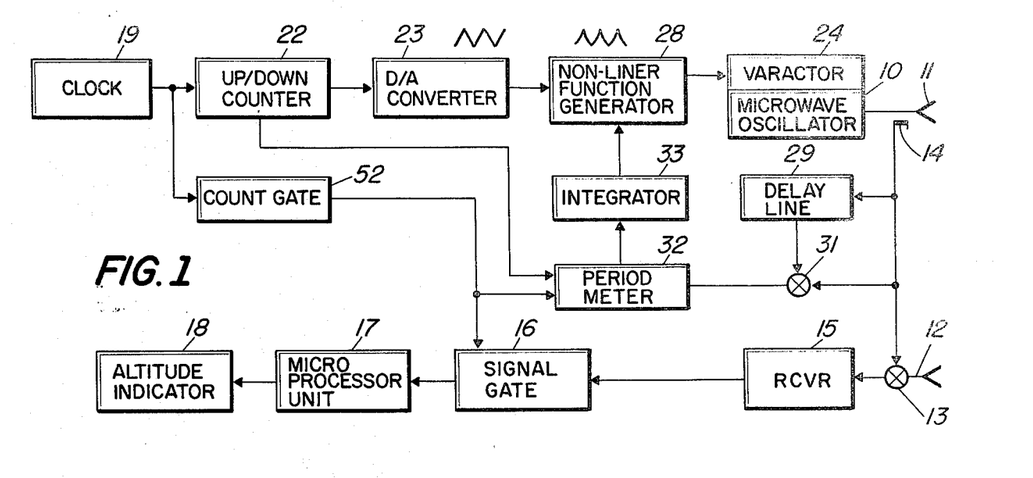
FIG. 1 is a simplified functional block diagram of an FM/CW radio altimeter incorporating the invention.

Referring to FIG. 1, which is a simplified block diagram of a radio altimeter of the FM/CW type, a microwave oscillator 10 radiates toward the ground through an antenna 11 a signal which is frequency modulated. The frequency of the transmitted signal varies linearly with time in accordance with a triangular modulating wave. The ground reflections of the transmitted signal are received by an antenna 12 and then mixed in mixer 13 with a portion of the outgoing signal, obtained through coupler 14, to produce a difference frequency signal, $F_d$, at the output of a receiver 15. All of the foregoing are well known elements of a radio altimeter of this type. As is further well known, the difference frequency signal, which is directly proportional to the height of the aircraft above ground, tends to be in error because of the discontinuity therein occurring at times corresponding to the peaks of the modulating wave.

In copending U.S. patent application Ser. No. 291,854, filed Aug. 10, 1981 by C. S. Kyriakos entitled "Means for Eliminating Step Errors in FM/CW Radio Altimeters" there is described means for eliminating the foreementioned errors in the height indication of the altimeter. Briefly, the difference frequency signal is interrupted by a signal gate 16 at times corresponding to the modulating waveform peaks. Data passed by signal gate 16 during the linear portions of the modulating waveform is processed by a microprocessor unit 17 to produce a display of the aircraft altitude on altitude indicator 18.

The triangular waveform which controls the frequency modulation of oscillator 10 is generated by a clock 19, an up/down counter 22 and a digital-to-analog converter 23. Up/down counter 22, beginning with a count of zero, accumulates a count of clock pulses from clock 19 until a maximum count is reached. Then counter 22 reverses and decrements the count accumulated therein for each clock pulse until a count of zero is reached, whereupon the cycle of counter 22 is repeated. Digital-to-analog converter 23 provides a continuous analog output of the instantaneous sum contained by counter 22, thereby producing a triangular waveform which varies linearly with time.

Modulation of the frequency of oscillator 10 is accomplished by applying a control bias to a varactor 24 which forms a part of the frequency determining network of oscillator 10. The capacity of varactor 24 does not vary linearly with control bias. When incorporated in the tuning circuit of oscillator 10, the oscillator frequency varies with varactor bias generally as shown by curve 25 of FIG. 2. In order to produce accurate altitude indications, however, the oscillator frequency must vary linearly with the voltage output of converter 23 as shown by line 26 of FIG. 2. The required oscillator frequency is generated by modifying the linear output of converter 23 in a non-linear function generator 28 (FIG. 1).

Figure 2:
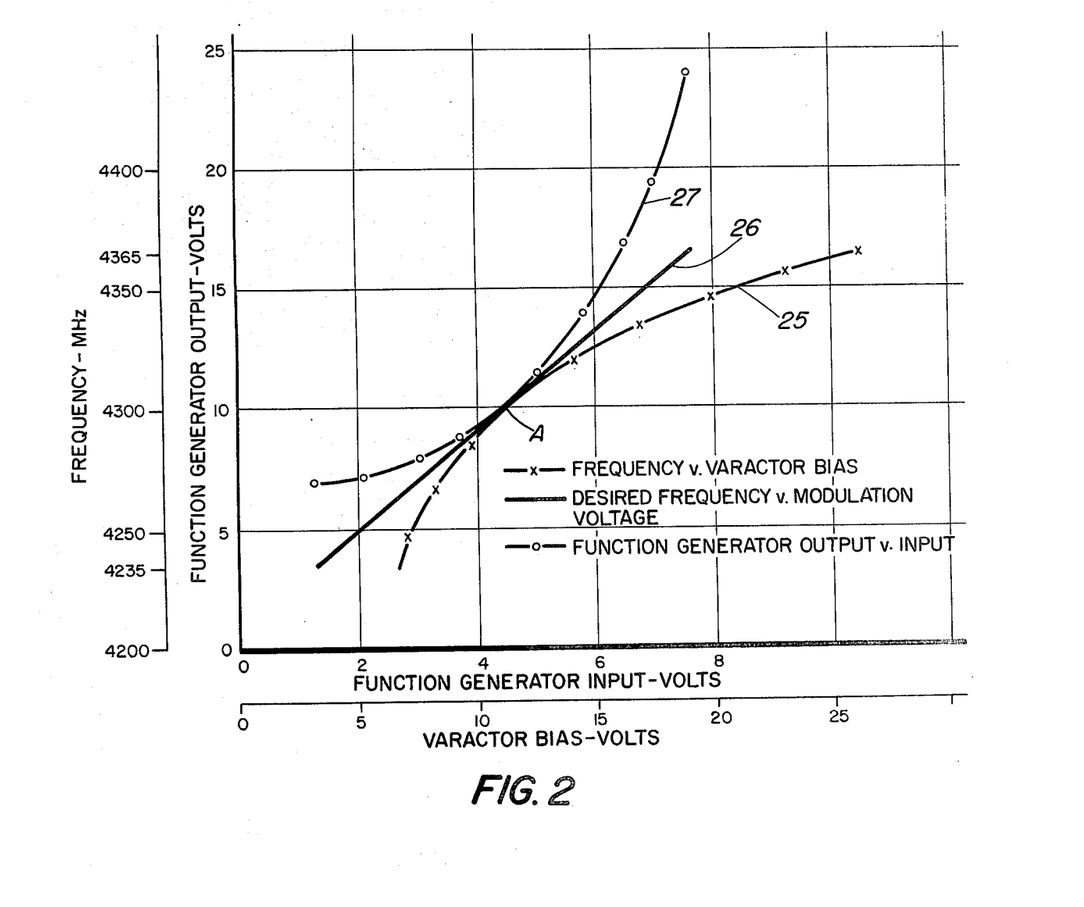
FIG. 2 is a chart showing the non-linear frequency v. varactor bias characteristic of a microwave transistor oscillator and showing the non-linear output required of the function generator used in the invention in order to achieve linear frequency modulation.

Curve 27 is a plot of varactor bias voltage output of function generator 28 against the linear modulation voltage output of converter 23. This plot is derived from line 26 and curve 25 to illustrate the form of the non-linear function needed from generator 28 in order to produce frequency modulation of oscillator 10 varying linearly with time in accordance with the output of converter 23.

If the oscillator frequency v. varactor bias characteristic 25 did not vary with production tolerances and did not vary with environmental conditions, particularly temperature, the only measure necessary to provide for linear frequency modulation of a varactor controlled microwave oscillator would be to tailor a specific non-linear function, as in curve 27, to the specific varactor characteristic, curve 25. However, the varactor characteristic does vary widely with production tolerances and with temperature thus, even with function 27 designed to compensate for the non-linearity of the characteristic 25 of a particular varactor measured at a specific temperature, linear frequency modulation would not be provided at any temperature other than the calibration temperature. Closed-loop means for controlling the output of function generator 28 will now be briefly described, with reference again to FIG. 1.

The height of the aircraft is given by a solution to the equation:

$$H = \frac{F_d \cdot C}{2\left(\frac{dF}{dt}\right)} \tag{1}$$

where:
H = altitude (feet)
$F_d$ = difference frequency (Hz)
C = velocity of light (ft./sec.)
dF/dt = rate of change of transmitter frequency (slope) Hz/sec.

In a specific embodiment of the invention, the transmitter frequency varies between 4235 MHz and 4365 MHz in accordance with a 150 Hz triangular wave. Therefore, $dF/dt = 3.94 \times 10^{10}$ and $C = 9.8 \times 10^8$ ft./sec. (approximately), so that equation (1) reduces to $H = F_d/80$ ft., provided that the modulation slope remains constant.

A delay line 29 having a fixed length of 300 ft. receives a portion of the transmitted wave from coupler 14. The output of delay line 29 is applied to a mixer 31 to which the transmitter signal from coupler 14 is also applied. The frequency difference signal from mixer 31 should, applying equation (1), possess a frequency of 24 kHz. If the difference frequency is higher or lower than 24 kHz an error is present in the transmitter modulation characteristic.

The period of the difference frequency signal from mixer 31 is measured by a period meter 32 and when the period departs from a value corresponding to that of 24 kHz an error signal is applied to integrator 33 which, in turn, adjusts the gain of function generator 28 in the proper sense to restore linearity to the modulation characteristic of oscillator 10.

Figure 3:
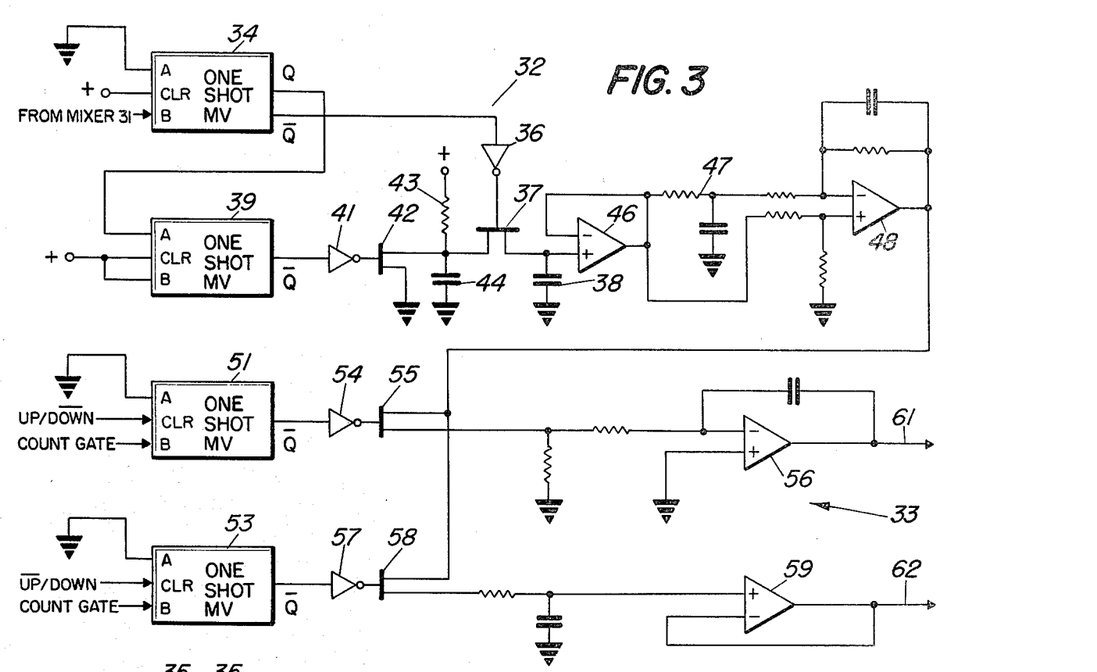
FIG. 3 is a schematic drawing of the period meter and sampling means for controlling the non-linear function generator used in the invention.
Figure 4A:
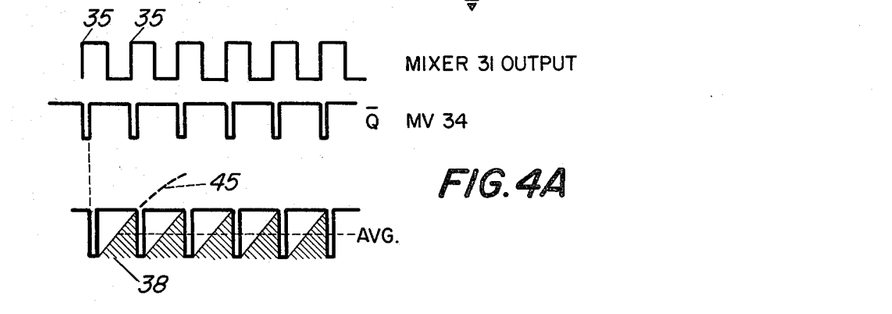
FIG. 4A is a timing diagram helpful in explaining the operation of the period meter in the circuit of FIG. 3.

Period meter 32 is shown in greater detail in FIG. 3 and the operation thereof is explained with reference to FIGS. 4a–4c. Referring to FIGS. 3 and 4, a one-shot multivibrator 34, having a period of 1.4 us., is triggered by the leading edges 35 of pulses of the calibration signal output of mixer 31. The complementary output $\overline{Q}$ of multivibrator 34 controls a sample and hold circuit including inverter 36, FET 37 and capacitor 38. The output Q of multivibrator 34 is applied to the A input of a one-shot multivibrator 39 which, by virtue of the positive voltage on the clear and B inputs thereto, triggers on the trailing edge of pulses applied to input A.

The $\overline{Q}$ output of multivibrator 39 controls a reset circuit including inverter 41 and FET 42 for a resistor 43-capacitor 44 charging circuit. Capacitor 44 normally charges along line 45 of FIG. 4a. When FET 42 is rendered conductive by the appearance of a negative-going pulse at the $\overline{Q}$ output of multivibrator 39, capacitor 44 is discharged to zero and immediately commences recharging when FET 42 again becomes nonconductive. In the meantime, the $\overline{Q}$ output of multivibrator 34 has rendered FET 37 conductive to permit transfer to capacitor 38 of the charge from capacitor 44 which existed immediately prior to the appearance of the $\overline{Q}$ output from multivibrator 39. The charge on capacitor 38 represented by the shaded area under line 45 of FIG. 4a, is applied through a voltage follower 46 both to a resistor-capacitor averaging circuit 47 and to the non-inverting input of a difference amplifier 48. The average value output of circuit 47 is applied to the inverting input of amplifier 48 so that the output of the latter is the difference between the peak value of the voltage stored on capacitor 38 and the long term average value of such voltage.

Figure 4B:
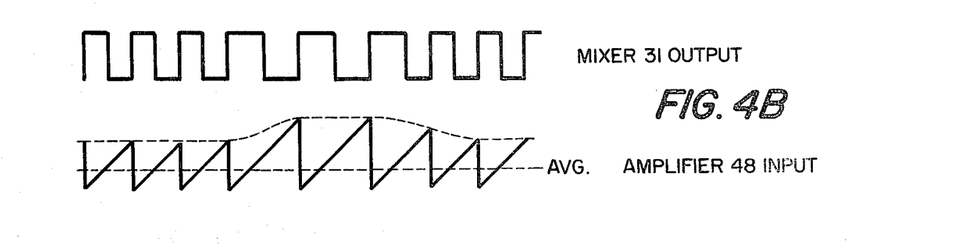
FIG. 4B is a timing diagram showing conditions in the circuit of FIG. 3 when the system oscillator frequency is below the value required for linear frequency modulation.
Figure 4C:
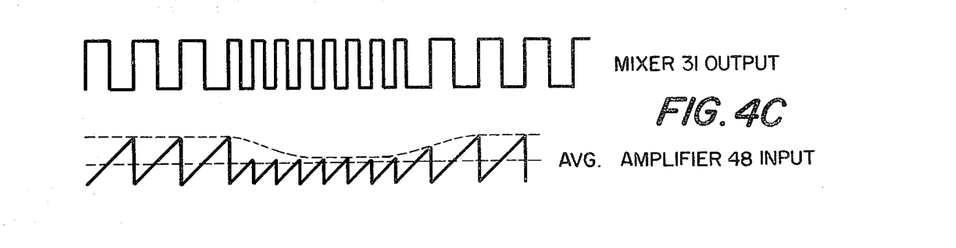
FIG. 4C is a diagram similar to FIG. 4B but with the oscillator frequency above the value required for linear frequency modulation.

Referring to FIG. 4b wherein the slope of the transmitter modulation characteristic is below the required value and to FIG. 4c wherein the slope of the transmitter modulation characteristic is above the required value, it will be seen that the peak output of amplifier 46 departs in a positive sense from the long term average peak value when the transmitter modulation characteristic is low and departs in a negative sense from the average peak value when the transmitter modulation characteristic is high. The output of amplifier 48 is sampled by means next to be described during a portion of the transmitter modulation characteristic lying below point A of FIG. 2 and during a portion of the characteristic lying above point A. The sampled outputs of amplifier 48 are used to separately control the gain of elements of non-linear function generator 28 respectively responsible for generating the portions of the non-linear function 27 (FIG. 2) below and above the point A.

Figure 5:
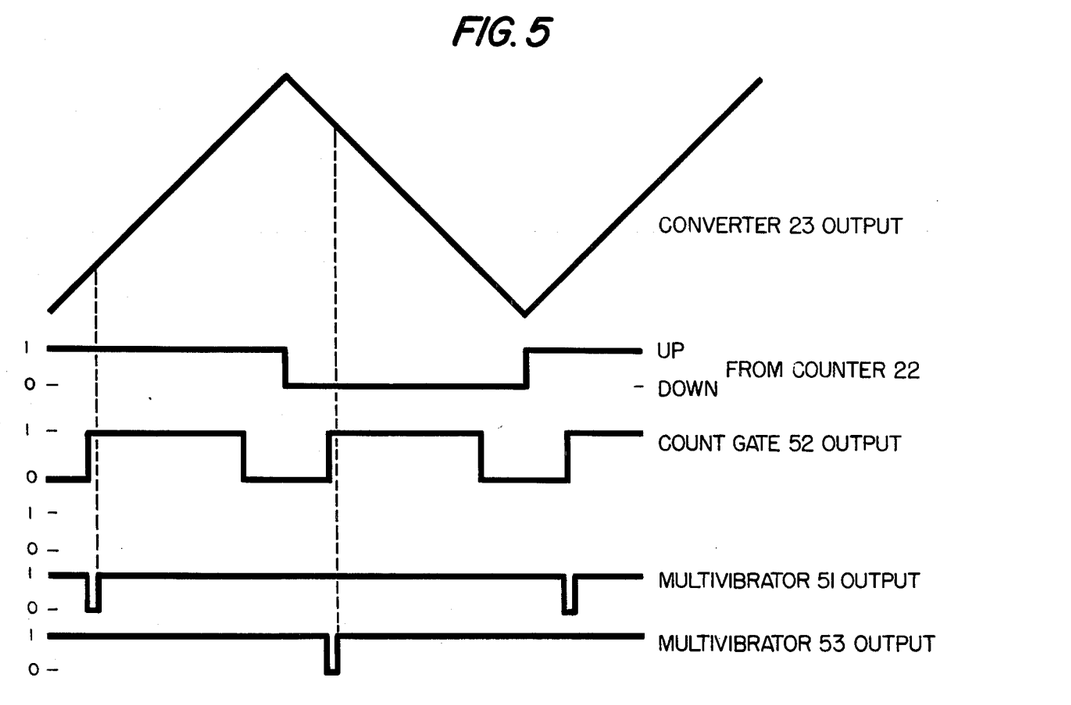
FIG. 5 is a timing diagram helpful in explaining the operation of the sampling means in the circuit of FIG. 3.

Referring to FIGS. 3 and 5, one-shot multivibrator 51 receives as inputs a logical signal from up/down counter 22 indicative of whether the counter is incrementing count therein (count up) or decrementing count (count down). The output of a count gate 52 is used primarily to control signal gate 16 as described in the aforesaid Kyriakos application. Multivibrator 51 triggers upon the appearance of the leading edges of signals from count gate 52 which occur during the time counter 22 is in the up count phase. One-shot multivibrator 53 receives as inputs the inverted up/down logic signal from counter 22 and the output of count gate 52. Multivibrator 53 triggers upon the appearance of leading edges of output signals from count gate 52 which occur during the down count phase of operation of counter 22.

The output periods of multivibrators 51 and 53 are each suitably of 14 us. duration. When multivibrator 51 is triggered, the complementary output thereof, inverted by inverter 54, renders FET 55 conductive for the multivibrator output period. A pulse of fixed duration but variable amplitude, according to the difference output of amplifier 48, is thus applied to an integrator 56. When multivibrator 53 is triggered, the complementary output thereof, inverted by inverter 57, renders FET 58 conductive for the fixed period of output from multivibrator 53 to apply a pulse of amplitude dependent upon the output of amplifier 48 to an integrator 59.

The output of integrator 56 appearing on line 61 is the integral of output samples taken from amplifier 48 during the initial portion of the up-count phase of counter 22, which corresponds to the portion of the non-linear function 27 lying below point A of FIG. 2. The output of integrator 59 appearing on line 62 is the integral of output samples taken from amplifier 48 during the initial portion of the down-count phase of operation of counter 22, corresponding to the portion of the non-linear function 27 lying above point A of FIG. 2. The outputs on lines 61 and 62 control the gains of separate elements of non-linear function generator 28, as will next be described.

Figure 6:
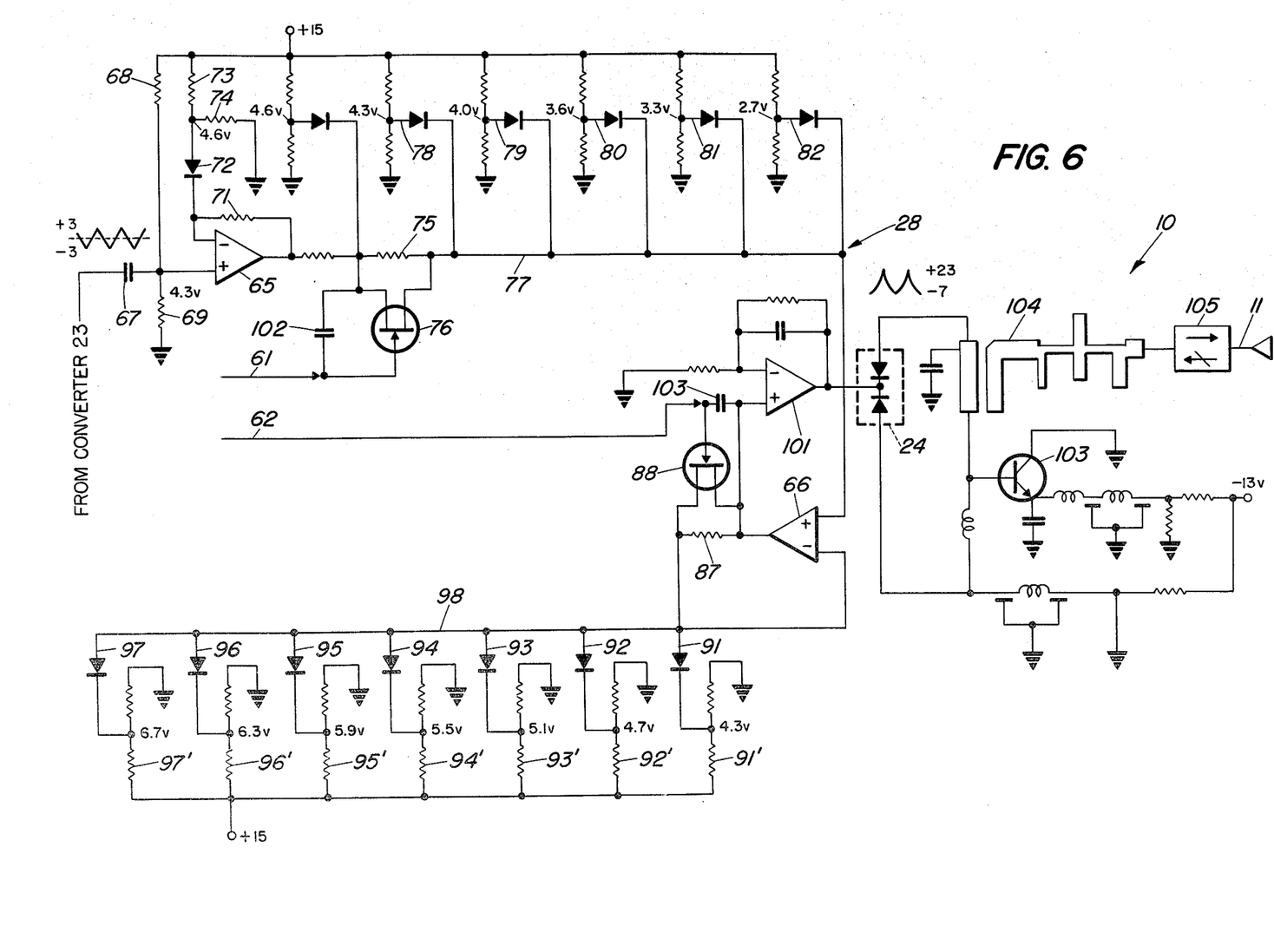
FIG. 6 is a schematic diagram of the non-linear function generator and microwave oscillator used in the invention.

FIG. 6 illustrates a non-linear function generator fulfilling the requirements of a specific embodiment of the invention. The function generator 28 includes operational amplifiers 65 and 66. The triangular wave output from converter 23 is applied at an amplitude of three volts through capacitor 67 to the biasing network of resistors 68 and 69 supplying a fixed bias of 4.3 volts. The biased triangular wave at the non-inverting input of amplifier 65 therefore varies between an amplitude of +1.3 and +7.3 volts. The feedback network of amplifier 65 includes resistor 71 and diode 72 which is forward biased to 4.6 volts by the voltage divider formed by resistors 73 and 74. For input voltages sufficiently positive to drive the voltage at the cathode of diode 72 greater than about 4.3 volts, the diode is cut-off and amplifier 65 operates as a unity gain voltage follower. For lower input voltages, such that the voltage at the cathode of diode 72 is less than about 4.3 volts, diode 72 conducts and the gain of amplifier 65 is determined by the values of resistors 71 and 74. A variable load resistance comprising resistor 75 and FET 76 is connected between the output of amplifier 65 and an input bus 77 to the non-inverting input of amplifier 66. A plurality of diode limiters 78–82 are connected to bus 77 to limit the voltage thereon at successively lower levels ranging between 4.3 and 2.7 volts as the output of amplifier 65 decreases linearly toward zero, thereby providing the portion of non-linear function 27 lying below point A (FIG. 2).

A variable feedback resistance circuit including resistor 87 and FET 88 is connected from the output of amplifier 66 to the inverting input thereof. A plurality of diodes 91–97 biased to conduct at successively higher levels by voltage divider networks 91'–97' are connected to a bus 98 leading to the inverting input of amplifier 66. When the voltage at the junction of resistor 87 and bus 98 rises to a level to render one or more of diodes 91–97 conductive, the grounded resistor of each of the voltage dividers 91'–97' associated with a conductive diode is effectively inserted in shunt from the inverting input of amplifier 66 to ground, thereby altering the gain of amplifier 66. When the voltage at the junction of resistor 87 and bus 98 is below the level at which any of the diodes 91–97 are conductive, amplifier 66 operates as a unity gain voltage follower. The output of amplifier 66 which comprises the combined lower portion of non-linear function 27 generated by amplifier 65 and its associated diodes 78–82 and the higher portion of non-linear function 27 contributed by amplifier 66 and its associated diodes 91–97, is amplified in an amplifier 101 to the level required by varactor 24 to vary the frequency of oscillator 10 through the desired frequency range. Varactor 24 is connected in the tuning circuit of oscillator 10 which includes a microwave transistor 103, microstrip elements 104 and isolator 105.

The bias levels selected for diodes 78-82 and 91-97 determine the general shape of the output function of generator 28. Adjustment of resistors 75 and 87 sets the average slopes of the lower and higher portions of the non-linear function to conform to that required by varactor 24 under particular calibration conditions. FET 76 and FET 88 each operate as resistors which vary linearly in accordance with the gate voltage applied thereto. Linearity of operation is improved through application of the voltage waveform at the source electrodes of the transistors to their respective gates through capacitors 102 and 103. Gate bias for FET 76 is received from line 61 leading to the output of integrator 56 (FIG. 3). Gate bias for FET 88 is supplied by line 62 from integrator 59 (FIG. 3). As described with reference to FIGS. 3 and 4, the outputs of integrators 56 and 59 vary positively or negatively in accordance with the departure of the frequency of the calibration signal output of mixer 31 from a long term average value of such frequency. Input samples to integrator 56 are provided during the initial portion of the rising triangular wave from converter 23 (FIG. 1) corresponding to the lower frequency outputs of oscillator 10. The output of integrator 56 is therefore used to control the conductivity of FET 76 to adjust the slope of the lower voltage portion of the non-linear function 27. Integrator 59 receives sample inputs during the initial portion of the downward slope of the triangular wave from converter 23 and the output of integrator 59 controls the conductivity of FET 88 to adjust the slope of the higher voltage portion of the non-linear function 27. Adjustment of the conductivities of FET 76 and FET 88 continues in closed loop fashion under control of integrators 56 and 59 until no frequency errors are present at either the lower or higher frequency outputs of oscillator 10. The integrator outputs then remain constant at the value necessary to eliminate frequency errors in the output of oscillator 10.

Obviously, specific values disclosed in connection with the non-linear function generator and the form of the function generator may be varied to meet the particular requirements of an oscillator. It is to be understood that the invention may be practiced otherwise than as specifically disclosed without departing from the spirit and scope of the appended claims.

The invention claimed is:

1. A linear sweep frequency modulator for an electronically tunable continuous wave oscillator having a non-linear frequency versus frequency control voltage characteristic, comprising:
    means providing a modulation wave having an amplitude varying linearly with time through substantially the entire cycle thereof;
    a non-linear function generator receiving said linear modulation wave and converting said linear wave to a non-linear wave synchronized with said linear wave, said non-linear wave being applied to said oscillator as said frequency control voltage, said non-linear wave being of such form as to cause the frequency of said oscillator to vary linearly in synchronism with said linear modulation wave for a particular frequency versus frequency control voltage characteristic of said oscillator;
    means for varying the form of said non-linear wave produced by said non-linear function generator to cause the frequency of said oscillator to vary linearly in synchronism with said linear modulation wave for a frequency control voltage versus frequency characteristic of said oscillator other than said particular one;
    means providing an oscillatory calibration signal the period of which is indicative of the linearity of frequency modulation of said oscillator;
    means for determining variations in the period of said calibration signal; and
    means for applying said variations in said calibration signal period to said means for varying the form of said non-linear wave in such sense as to cause said variations in said calibration signal period to be reduced.

2. A linear sweep frequency modulator as claimed in claim 1 wherein said means providing a modulation wave comprises a triangular wave generator.

3. A linear sweep frequency modulator as claimed in claim 2 wherein said means providing a calibration signal includes:
    a delay line receiving an input signal from the output of said oscillator and providing a delayed output signal; and
    a mixer receiving a first input signal from the output of said oscillator and a second input signal from the output of said delay line and producing said calibration signal as the output thereof, said calibration signal having a frequency equal to the absolute value of the difference between the frequencies of said first and second input signals.

4. A linear sweep frequency modulator as claimed in claim 2 wherein said means for determining variations in the period of said calibration signal includes:
    a capacitor charging circuit having an output which increases substantially linearly with time;
    means for sampling said capacitor charging circuit output at a selected phase of said calibration signal; and
    means for resetting said capacitor charging circuit output to zero at a fixed time after operation of said sampling means.

5. A linear sweep frequency modulator as claimed in claim 4 wherein said means for determining variations in the period of said calibration signal further includes:
    means providing the average value over a relatively long term time period of samples produced by said means for sampling;
    means providing the peak values of samples produced by said means for sampling; and
    means providing the difference between said peak and said long term average values.

6. A linear sweep frequency modulator as claimed in claim 2, wherein said means for varying the form comprises:
    first means for sampling the output of said means for determining variations in the period of said calibration signal at a time during the output cycle of said triangular wave generator corresponding to lower frequency outputs of said oscillator;
    second means for sampling the output of said means for determining variations in the period of said calibration signal at a time during the output cycle of said triangular wave generator corresponding to higher frequency outputs of said oscillator;
    means applying the output of said first sampling means to said non-linear function generator to control the form of said non-linear wave during a portion thereof corresponding to lower frequency outputs of said oscillator; and means applying the output of said second sampling means to said non-linear function generator to control the form of said non-linear wave during a portion thereof corresponding to higher frequency outputs of said oscillator.

7. A linear sweep frequency modulator for an electronically tunable continuous wave oscillator having a non-linear frequency versus frequency control voltage characteristic, comprising:

a triangular wave generator providing a triangular wave output which varies linearly with time between maximum and minimum peak values;

a non-linear function generator receiving said triangular wave and converting the same into a non-linear wave of the form required by said oscillator frequency versus frequency control voltage characteristic for linear frequency modulation of said oscillator output;

means applying the output of said function generator to said oscillator as the frequency control voltage therefor;

means providing a calibration signal having a constant frequency whenever the frequency modulation of said oscillator is linear;

means providing an output related to the amount of the departure of the frequency of said calibration signal from said constant frequency;

means controlled by said triangular wave generator for providing a first timing signal at a time proximate to the occurrence of a minimum peak value of said triangular wave and for providing a second timing signal at a time proximate to the occurrence of a maximum peak value of said triangular wave;

means responsive to said first timing signal for providing a first sample of the output of said calibration signal frequency departure means;

means for applying said first sample to said non-linear function generator for controlling the form of a first portion of said function generator output;

means responsive to said second timing signal for providing a second sample of the output of said calibration signal frequency departure means; and means applying said second sample to said non-linear function generator for controlling the form of a second portion of said function generator output.

8. A linear sweep frequency modulator as claimed in claim 7 wherein said non-linear function generator includes:

a first amplifier;

a plurality of limiting means connected to the output of said first amplifier, said limiting means including respective diodes biased to conduct in succession at progressively lower levels as the level of the output of said first amplifier decreases;

a first circuit having a variable resistance electrically connected with said limiting means to adjust a resistance thereof;

a second amplifier;

a second circuit having variable resistance connected from the output of said second amplifier to an input thereof;

a second plurality of diodes each having an associated resistor and each having an electrode thereof connected in common to the connection of said amplifier input and said second variable resistance circuit, said second plurality of diodes being biased to conduct at successively higher levels as the level of output of said second amplifier increases, the conduction of each said diode of said second plurality causing its said associated resistor to be electronically connected, to change an impedance of said plurality of diodes and associated resistors, with said second variable resistance circuit and said second amplifier input whereby the gain of said second amplifier is altered; and means for combining the outputs of said first and second amplifiers to provide the output of said function generator.

9. A linear sweep frequency modulator as claimed in claim 8, wherein said means applying said first sample controls the resistance of one of said variable resistance circuits in accordance with said first sample and said means applying said second sample controls the resistance of the other of said variable resistance circuits in accordance with said second sample.

10. A linear sweep frequency modulator as claimed in claim 9 wherein said triangular wave generator comprises:

a clock oscillator;

an up-down counter having a minimum count capacity and a maximum count capacity, said counter receiving the output of said clock oscillator and incrementing a count of clock cycles beginning at said minimum count until said maximum count is reached then decrementing the count of clock cycles until said minimum count is again reached, said minimum count corresponding to said minimum peak value of said triangular wave and said maximum count corresponding to said maximum peak value thereof; and a digital-to-analog converter for converting the count of said counter to an analog quantity constituting said triangular wave.

11. A linear sweep frequency modulator as claimed in claim 10 wherein said means providing a first and a second timing signal comprises:

second counting means for counting output cycles of said clock oscillator and providing said first timing signal for a count of said cycles proximate to said minimum count of said up-down counter and providing said second timing signal for a count of said cycles proximate to said maximum count of said up-down counter.

12. A linear sweep frequency modulator as claimed in claim 11 wherein said means responsive to said first timing signal and said means responsive to said second timing signal each comprises:

a one-shot multivibrator providing an enabling signal output of fixed duration in response to a timing signal input thereto; and a normally non-conductive switching circuit connected between said means providing an output related to the departure of the frequency of said calibration signal and said sample applying means, said switching means being rendered conductive by said enabling signal for the duration of said enabling signal.

13. A linear sweep modulator as claimed in claim 12 wherein said means applying said first sample and said means applying said second sample each comprises:

an integrating circuit.

14. A linear sweep frequency modulator as claimed in claim 7 wherein said means providing a calibration signal comprises:

a delay line receiving an input signal from said continuous wave oscillator and providing a delayed output signal; and a mixer receiving from said continuous wave oscillator a first input signal having the same phase as said delay line input signal and receiving a second input signal from the output of said delay line and providing an output signal having a frequency equal to the absolute value of the difference between the frequencies of said first and second input signals.

* * * * *